United States Patent
Lu et al.

(10) Patent No.: US 11,122,690 B2
(45) Date of Patent: Sep. 14, 2021

(54) ADDITIVE MANUFACTURING TECHNIQUES FOR MEANDER-LINE POLARIZERS

(71) Applicant: Hughes Network Systems, LLC, Germantown, MD (US)

(72) Inventors: Bingqian Lu, Germantown, MD (US); Peter Hou, Germantown, MD (US); Taiwei Yue, Germantown, MD (US); Brian Clough, Germantown, MD (US); Harry Johnson, Germantown, MD (US); John Corrigan, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

(21) Appl. No.: 16/236,812

(22) Filed: Dec. 31, 2018

(65) Prior Publication Data
US 2020/0214140 A1    Jul. 2, 2020

(51) Int. Cl.
*H05K 3/12* (2006.01)
*H05K 1/09* (2006.01)
(Continued)

(52) U.S. Cl.
CPC ..... *H05K 3/1225* (2013.01); *B29D 11/00644* (2013.01); *B33Y 70/00* (2014.12);
(Continued)

(58) Field of Classification Search
CPC ........ B29D 11/00644; B29K 2067/003; B33Y 10/00; B33Y 70/00; B33Y 80/00;
(Continued)

(56) References Cited

U.S. PATENT DOCUMENTS 3,904,994 A * 9/1975 Bates ............... H01J 23/24
                                                    333/161
4,387,377 A   6/1983 Kandler
(Continued)

FOREIGN PATENT DOCUMENTS

GB       2558365       7/2018
WO    WO2014118783    8/2014

OTHER PUBLICATIONS copprint.com [online], "Conductive Copper Printing," [retrieved on Feb. 27, 2019], retrieved from URL<http://copprint.com/>, 17 pages.

(Continued)

*Primary Examiner* — Minh N Trinh
(74) *Attorney, Agent, or Firm* — Fish & Richardson P.C.

(57) ABSTRACT

Methods, systems, and apparatus, including computer programs encoded on a computer storage medium, for producing meander-line polarizers. In some implementations, a meander-line polarizer includes a dielectric substrate made of a polyester polymer material and meander-line arrays formed on a surface of the dielectric substrate. Each meander-line array includes a sequence of alternating perpendicular conductive traces that are formed the surface of the dielectric substrate by applying conductive ink to the surface of the dielectric substrate using a template that defines a location and dimensions of each conductive trace of each meander-line array.

9 Claims, 4 Drawing Sheets

(51) Int. Cl.
*H05K 1/03* (2006.01)
*B33Y 80/00* (2015.01)
*B29D 11/00* (2006.01)
*B33Y 70/00* (2020.01)
*B41M 3/00* (2006.01)
*H01Q 15/24* (2006.01)
*B29K 67/00* (2006.01)
*B33Y 10/00* (2015.01)

(52) U.S. Cl.
CPC .............. *B33Y 80/00* (2014.12); *B41M 3/003* (2013.01); *B41M 3/006* (2013.01); *H01Q 15/244* (2013.01); *H05K 1/0353* (2013.01); *H05K 1/092* (2013.01); *B29K 2067/003* (2013.01); *B33Y 10/00* (2014.12); *H05K 2201/0145* (2013.01); *H05K 2201/09263* (2013.01); *H05K 2203/013* (2013.01); *H05K 2203/0121* (2013.01)

(58) Field of Classification Search
CPC ..... B41M 3/003; B41M 3/006; H01Q 15/244; H05K 1/0353; H05K 1/092
See application file for complete search history.

(56) References Cited

U.S. PATENT DOCUMENTS

| | | | |
|---|---|---|---|
| 7,205,954 B2 * | 4/2007 | Yamagajo | G06K 19/0726 343/795 |
| 7,817,102 B2 * | 10/2010 | Taki | H01Q 1/36 343/895 |
| 2015/0197063 A1 | 7/2015 | Shinar et al. | |
| 2016/0156108 A1 * | 6/2016 | Thomas | H01Q 15/244 343/909 |
| 2016/0218287 A1 | 7/2016 | McAlpine et al. | |
| 2020/0052409 A1 * | 2/2020 | Scannell | B33Y 80/00 |
| 2020/0214140 A1 * | 7/2020 | Lu | H05K 1/0353 |

OTHER PUBLICATIONS

Gsitech.com [online], "Multi-Process Printing Solutions," year 2017, [retrieved on: Feb. 27, 2019], retrieved from: URLhttp://www.gsitech.com/labels-and-printed-electronics-flexo-screen-digital/, 5 pages.
Letizia et al., "Oblique Incidence Design of Meander-Line Polarizers for Dielectric Lens Antennas," Progress in Electromagnetics Research B, vol. 45, 309-335, year 2012, 27 pages.
Zhang et al., "Multifunctional Meander Line Polarizer," Progress in Electromagnetics Research Letters, vol. 6, 55-60, year 2009, 6 pages.

* cited by examiner

ADDITIVE MANUFACTURING TECHNIQUES FOR MEANDER-LINE POLARIZERS

BACKGROUND

Meander-line polarizers are used to convert waves from linear polarization to circular polarization and vice versa. Meander-line polarizers can be used with a wide variety of aperture-type antennas. In general, a meander-line polarizer includes multiple meander-line conductive strip arrays ("meander-line arrays") arranged on a substrate. Some meander-line polarizers include multiple layers that each include meander-line arrays arranged on substrates. The various layers are typically separated using spacers.

SUMMARY

In some implementations, an additive manufacturing system produces meander-line polarizers by applying conductive ink to substrates. A meander-line polarizer includes an arrangement of meander-line arrays. Each meander-line array includes a sequence of alternating perpendicular conductive traces. The meander-line arrays are spaced apart from one another, e.g., with a uniform distance between each pair of meander-line arrays.

In some implementations, the additive manufacturing system produces the meander-line polarizers based on a template that defines the dimensions and locations of the meander-line arrays and their conductive strips. The template can be a screen that is placed over the substrate prior to applying the conductive ink to the substrate. The screen can include apertures in the desired location and arrangement for the meander-line arrays on the substrate. In this way, the conductive ink can be applied over the screen and the conductive ink can flow through the apertures onto the surface of the substrate to form the meander-line arrays on the surface of the substrate. A scraper, e.g., squeegee or other appropriate scraping device, can then be applied to the substrate and moved from one side of the screen to the other to remove excess conductive ink and to push conductive ink through the apertures.

In some implementations, an inkjet printer prints the conductive traces onto the surface of the substrate based on a template that defines the dimensions and locations of the meander-line arrays and their conductive strips. For example, the template can be stored in an electronic file that is sent to the inkjet printer. In a particular example, the template can be an image of the meander-line arrays and the file can be an image file. The inkjet printer can apply conductive ink to the substrate based on the template to form the meander-line arrays.

In some implementations a three-dimensional (3D) printer prints the conductive traces on the surface of the substrate based on a model that defines the dimensions and locations of the meander-line arrays and their conductive strips. For example, the model can be specified in a stereolithography file (e.g., an .STL file). The 3D printer can apply conductive ink to the substrate based on the model.

In some implementation, the 3D printer prints the substrate and the meander-lines arrays based on a model. For example, the 3D printer can print the dielectric substrate using a material for the substrate and then print the conductive traces on the substrate using a conductive ink.

Meander-line polarizers can also be produced using core materials that have copper sheets laminated on both sides. The meander-line polarizer can be produced by photo-etching away the unused copper from both sides of the material, leaving only the meander-line arrays on one side of the material. As the meander-line arrays of copper traces only occupy a small fraction of the surface area of the copper sheet, most of the copper is etched away. As the meander-line arrays are only on one side of the material, the entire copper area of the second side is etched away.

This etching process is more expensive than the additive manufacturing techniques described herein as the copper sheets include substantially more copper than needed for the polarizers. This etching process also wastes substantially more conductive material than the additive manufacturing techniques as most of the copper of the copper sheets is wasted by being etched away.

The dielectric material used in the photo-etching processes is designed to withstand high temperature of lamination and oven flow. These dielectric materials are expensive due to the tight control of electrical properties and thermal expansion during manufacturing. However, meander-line polarizers are not required to be laminated with the rest of the planar printed circuit board of the antenna that will use the polarizer.

Using the additive manufacturing techniques described herein, the dielectric material for the meander-line polarizer does not have to withstand high temperatures, e.g. due to not having a via in the polarizer and not having to go through lamination or soldering process, resulting in further reduction in costs for the meander-line polarizers and more flexibility in selecting dielectric materials for the polarizers. For example, the substrate can be made of thinner, less expensive materials, such as polyester (e.g., polyethylene terephthalate (PET)). The substrate can also be made of water-soluble materials, such as paper, or materials that absorb water, unlike the substrates in water-based photo-etching processes. Similar techniques can be used to produce frequency-selective surfaces (FSSs) and other electronic circuits that are typically produced using etching, resulting in similar cost and material waste savings.

The additive manufacturing techniques described herein also allow for non-uniform print thickness or metallization selection across the layer of conductive trace. The techniques also allow printing different metals on top of one another to form the conductive traces and/or printing of mixtures of metals and non-metals in mixtures or in layers. These could provide, for example, protective layers against oxidation, corrosion, or moisture. The techniques also allow spot curing, annealing, and/or printing of meander-line patterns on non-flat surfaces. The additive manufacturing techniques can also allow uniform or non-uniform spacing between layers, uniform or non-uniform spacing between arrays of meander lines, and/or uniform or non-uniform meander dimensions in width, length, or thickness.

In one general aspect, the techniques disclosed herein describe meander-line polarizers and methods of producing meander-line polarizers. For example, a meander-line polarizer can include a dielectric substrate made of a polyester polymer material and meander-line arrays formed on a surface of the dielectric substrate. Each meander-line array can include a sequence of alternating perpendicular conductive traces that are formed the surface of the dielectric substrate by applying conductive ink to the surface of the dielectric substrate using a template that defines a location and dimensions of each conductive trace of each meander-line array.

Implementations can include one or more of the following features. In some implementations, the polyester material is PET. The conductive traces of the meander-line arrays can be formed on the surface of the dielectric substrate by an inkjet printer.

In some implementations, the conductive traces of the meander-line arrays are formed on the surface of the dielectric substrate using a screen printing process. The template can include a screen that includes an aperture for each meander-line array. The screen printing process can apply, for each conductive trace, conductive ink to the surface of the dielectric substrate by placing the screen over the surface of the dielectric substrate and applying the conductive ink over the screen.

In another general aspect, the techniques disclosed herein describe methods of producing meander-line polarizers. For example, a method includes receiving, by an additive manufacturing device, a template that defines an arrangement of meander-line arrays for a meander-line polarizer. Each meander-line array can include a sequence of alternating perpendicular conductive traces. The template can define dimensions of each conductive trace and a location of each conductive trace in the arrangement. The additive manufacturing device can receive a dielectric substrate made of a polyester polymer material. The additive manufacturing device can generate, using the template, the meander-line arrays on the surface of the dielectric substrate by applying, for each conductive trace, conductive ink to the surface of the dielectric substrate in the location for the conductive trace defined by the template and with the dimensions for the conductive trace defined by the template. In some implementations, the polyester material is PET.

In some implementations, the template can include a screen that includes an aperture for each meander-line array. The aperture for a meander-line array can be located in the screen at a location for the meander-line array defined by the template. Applying, for each conductive trace, conductive ink to the surface of the dielectric substrate can include placing the screen over the surface of the dielectric substrate and applying the conductive ink over the screen. Applying, for each conductive trace, conductive ink to the surface of the dielectric substrate can include spreading the conductive ink across the screen and into the apertures. Spreading the conductive ink across the screen and into the apertures can include moving a scraper over the screen from a first side of the screen to a second side of the screen opposite the first side of the screen.

In some implementations, the additive manufacturing device is a screen printing device. Receiving, by the additive manufacturing device, a dielectric substrate made of a polyester polymer material can include receiving a portion of a roll of the dielectric substrate.

Some implementations can include determining that a particular conductive trace of a particular meander-line array applied to the surface of the dielectric substrate has a width that is greater than a maximum width for the particular conductive trace defined by the template and removing, using etching or a laser, at least a portion of the particular conductive trace such that the width of the particular trace is equal to or less than the maximum width.

In some implementations, the conductive ink includes one of conductive copper ink or conductive silver ink. Applying, for each conductive trace, conductive ink to the surface of the dielectric substrate can include applying, by an inkjet printer, the conductive ink for each conductive trace in a location on the surface of the dielectric substrate defined by the template.

Other embodiments include corresponding systems, apparatus, and software programs, configured to perform the actions of the methods, encoded on computer storage devices. A device or system of devices can be so configured by virtue of software, firmware, hardware, or a combination of them installed so that in operation cause the system to perform the actions. One or more software programs can be so configured by virtue of having instructions that, when executed by data processing apparatus, cause the apparatus to perform the actions.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
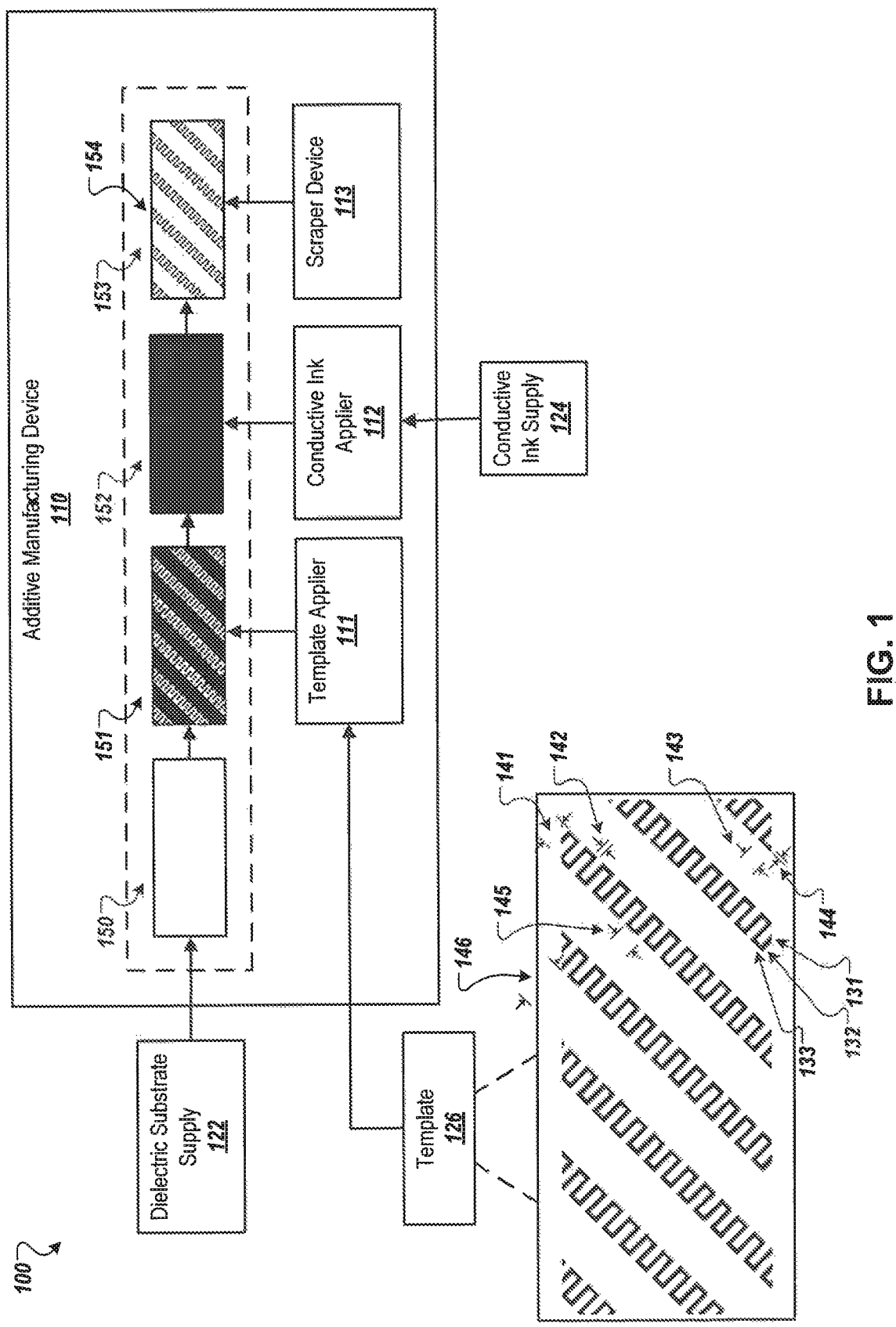
FIG. 1 is a diagram that illustrates an example of a system for producing meander-line polarizers using additive manufacturing techniques.

FIG. 1 is a diagram that illustrates an example of a system 100 for producing meander-line polarizers 153 using additive manufacturing techniques. The system 100 includes an additive manufacturing device 110 that produces meander-line polarizers using additive manufacturing techniques. For example, the additive manufacturing device 110 can be a screen printing device or another type of conductive ink printing device, e.g., a device that performs inkjet printing, 3D printing, pad printing, silk screen printing using a drum process, or silk screen printing using a flatbed process. In the example illustrated in FIG. 1, the additive manufacturing device 110 be a screen printing device, but techniques for using the other additive manufacturing devices are described below.

The additive manufacturing device 110 includes a template applier 111, a conductive ink applier 112, and a scraper device 113. The additive manufacturing device 110 can also include a surface on which the meander-line polarizers are produced. A dielectric substrate 150 can be placed on the surface so that meander-line arrays of the meander-line polarizer can be formed on a surface of the dielectric substrate 150.

The dielectric substrate 150 can be placed on the surface of the additive manufacturing device 110 manually, e.g., by a person, or automatically using an automatic feed. For example, an automatic feed can feed the dielectric substrate onto the surface of the additive manufacturing device 110 from a dielectric substrate supply 122, e.g., a roll of dielectric substrates. The additive manufacturing device 110 or the automatic feed can then cut a portion of the dielectric substrate for the meander-line polarizer.

The dielectric substrate 150 can be made of a thin dielectric material having an appropriate dielectric constant for the meander-line polarizer. In some implementations, the dielectric substrate 150 is a plastic film having the appropriate dielectric constant. For example, the dielectric substrate 150 can be a polyimide film. In some implementations, the dielectric substrate 150 is a polyester material, e.g., a polyester film. For example, the dielectric substrate 150 can be made of PET. These dielectric materials can be packed on rolls and fed to the additive manufacturing device 110 for producing the meander-line polarizers.

The template applier 111 can apply a template 126 for the meander-line polarizers on a surface of the dielectric substrate 150, forming a template-covered dielectric substrate 151. The template 126 can be a screen that includes meander-line array apertures 131 for meander-line arrays of the meander-line polarizers. For ease of illustration and description the apertures are shown in black and the remaining screen is shown in white in the template 126. However, the apertures are shown in white and the remaining screen is shown in black in the template-covered dielectric substrate 151 described below.

Each meander-line array aperture 131 includes a sequence of alternating perpendicular strips 132 and 133 that correspond to alternating perpendicular conductive traces of the meander-line arrays 154 of the meander-line polarizer 153. The template 126 can define the arrangement of the meander-line arrays that will be formed on the dielectric substrate 150. For example, the meander-line array apertures of the template 126 defines the location of each meander-line array and its conductive traces relative to each other meander-line array. The meander-line array apertures of the template 126 also defines the dimensions of each conductive trace.

For a meander-line polarizer to properly convert waves between linear polarization and circular polarization, the length and width of each conductive trace and the distance between each pair meander-line arrays need to be within respective tolerances. Thus, the meander-line array apertures 131 have to be cut (or otherwise removed) from screens according to the required dimensions and arrangement, and such that the resulting meander-line arrays are within the tolerances.

As shown at reference numeral 141, the template 126 defines the length of the vertical conductive traces. At reference numeral 142, the template 126 define the width of the vertical conductive traces. Similarly, the template 126 defines the length of the horizontal conductive traces at reference numeral 143 and the width of the horizontal conductive traces at reference numeral 144. The terms "vertical" and "horizontal" are used to reference the different perpendicular traces and are not meant to imply that the traces are horizontal and vertical. For example, as shown in FIG. 1, the traces can be in a diagonal direction. However, each horizontal trace can be parallel with each other and each vertical trace can be parallel with each other, such that each meander-line array has a square-wave pattern.

Each meander-line array has a repeating pattern of two vertical traces and two horizontal traces. As shown at reference numeral 145, the template 126 defines the length of each repeating pattern. The template 126 also defines the distance between each pair of meander-line arrays as shown at reference numeral 146.

In an inkjet printing implementation, the template 126 can be an image that shows the meander-line arrays rather than having meander-line array apertures 131. For example, the image can depict a white background with meander-line arrays in black. The dimensions and arrangement of the meander-line arrays in the image can correspond to the dimensions and arrangement of the meander-line arrays of the meander-line polarizer. In a 3D printing implementation, the template 126 can include a 3D model of the meander-line arrays and/or the dielectric substrate 150, e.g., that is stored in a .STL file. For example, the model can define the dimensions and arrangement of the meander-line arrays, the material of the conductive traces (e.g., the conductive ink for the traces) and the dimensions and material of the dielectric substrate 150.

In a screen printing implementation, the template applier 111 can be a device, e.g., a robot arm or other appropriate device, that picks up a template 126 and places the template 126 over the dielectric substrate 150. In some implementations, a person manually places the template 126 over the dielectric substrate 150. The person or template applier 111 can also temporarily secure the template to the dielectric substrate 150, e.g., using tape or another appropriate temporary adhesive.

The conductive ink applier 112 can apply conductive ink from a conductive ink supply 124 to the template-covered dielectric substrate 151, forming an ink-covered template and substrate 152. The conductive ink can be copper ink, silver ink, or another appropriate ink or liquid that adequately conducts electricity for use as conductive traces of meander-line polarizers. The conductive ink applier 112 can spray or release the conductive ink over all, or just a portion, of the template-covered dielectric substrate 151. In some implementations, a person can apply the ink to the template-covered dielectric substrate 151.

When applied, the conductive ink penetrates through the meander-line array apertures and lies on the surface of the dielectric substrate 150. In some implementations, a scraper, e.g., a squeegee, is used to remove excess conductive ink from the template 126 and/or to push conductive ink through the meander-line array apertures 131. For example, the scraper device 113, which can be automated, can apply the scraper to one side of the template 126 and move the scraper across the surface to the template 126 to the other side of the template 126.

The template 126 can have thickness that is based on a desired thickness of the conductive traces of the meander-line polarizer 153. The thickness is measured from a bottom surface of the template 126 that lies on the surface of the dielectric substrate to a top surface opposite the bottom surface. The thickness of the template 126 controls how much conductive ink can penetrate the meander-line array aperture and remain in the aperture after the scraper is applied, thus controlling the thickness of the conductive traces.

The conductive ink dries on the surface of the dielectric substrate 150, forming the conductive traces of the meander-line arrays 154 of the meander-line polarizer 153. In some implementations, the additive manufacturing device 110 includes a dryer, e.g., a forced hot air dryer, that dries the conductive ink faster. In another example, the additive manufacturing device 110 includes a dryer that heats the ink directly, e.g., using a laser, or a radiated heat source, e.g., similar to a space heater.

Meander-line polarizers can be used in different applications and to convert waves of different wavelengths. Meander-line polarizers for different applications can include different arrangements of meander-line arrays and/or meander-line arrays with different dimensions. Each different meander-line polarizer can have a corresponding template, e.g., a corresponding screen or a corresponding image. In this way, different meander-line polarizers can be produced simply by using a different template.

Although the system 100 has been described in terms of meander-line polarizers, the system 100 can also be used to produce other circuits, e.g., frequency-selective surfaces (FSSs).

Figure 2:
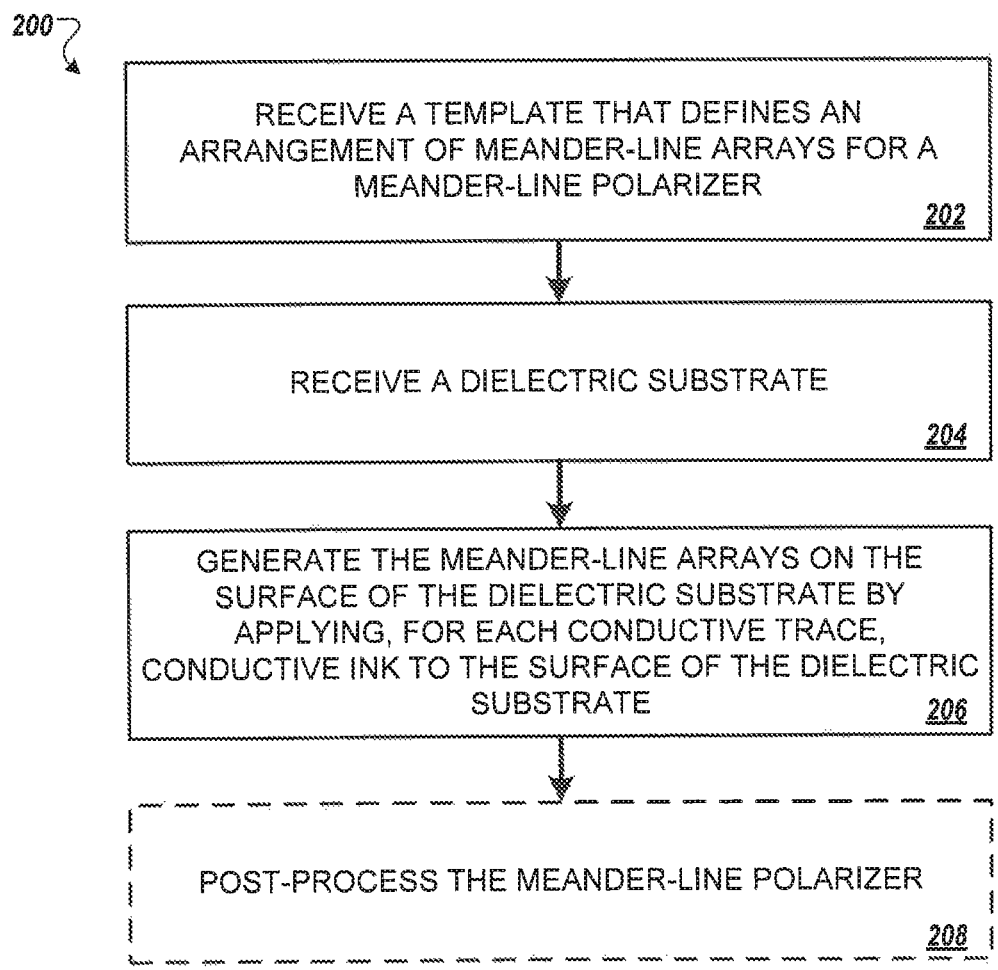
FIG. 2 is a flow diagram that illustrates an example process for producing meander-line polarizers using additive manufacturing techniques.
Figure 3:
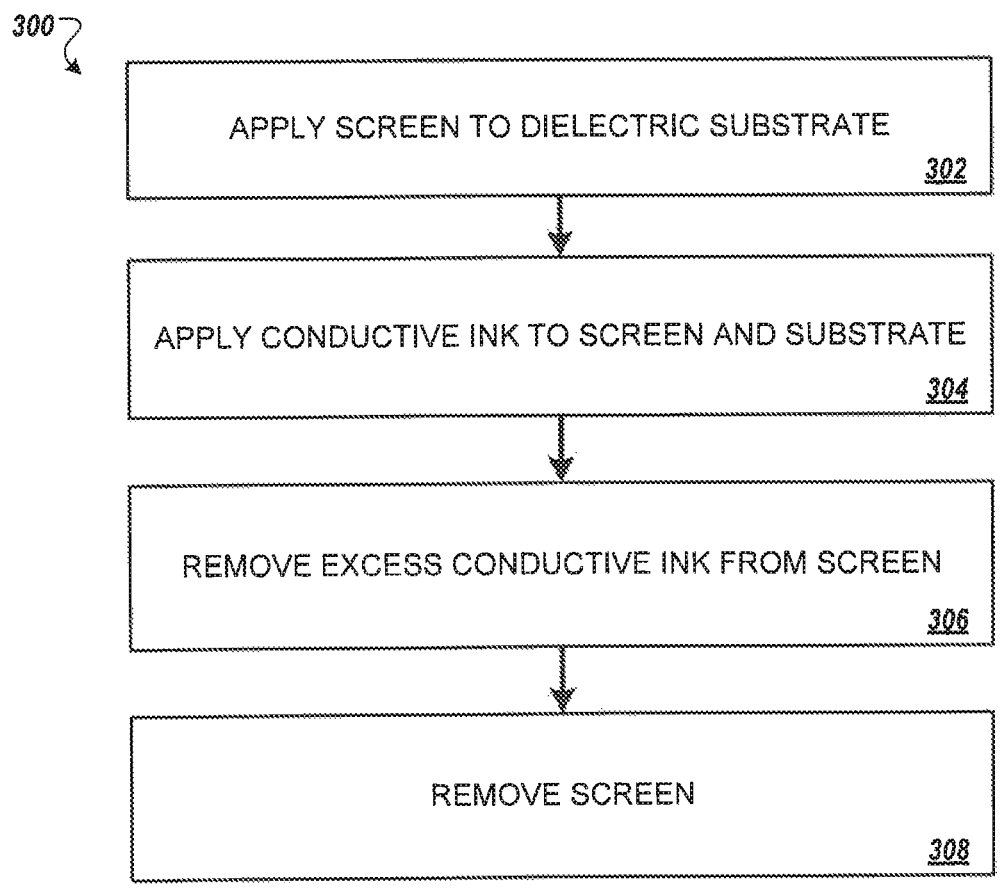
FIG. 3 is a flow diagram that illustrates an example screen printing process for producing meander-line polarizers.
Figure 4:
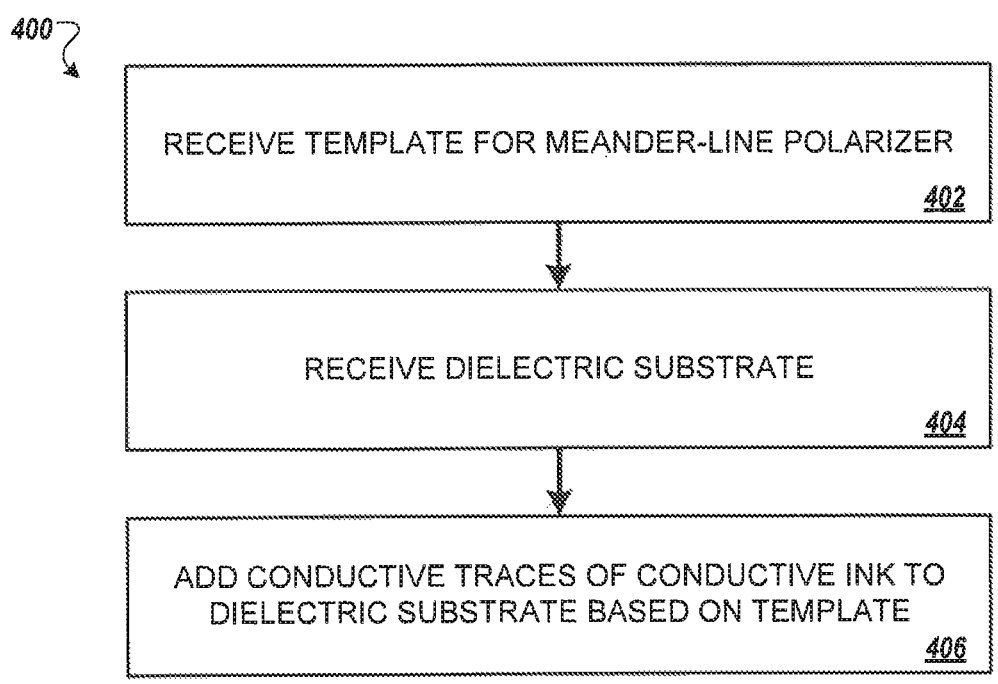
FIG. 4 is a flow diagram that illustrates an example inkjet printing process for producing meander-line polarizers.

FIGS. 2-4 are flow diagrams that illustrated example processes for producing meander-line polarizers using additive manufacturing techniques. FIG. 3 illustrates an example screen printing process and FIG. 4 illustrates an example conductive printing process, e.g., using an inkjet printer or 3D printer.

FIG. 2 is a flow diagram that illustrates an example process 200 for producing meander-line polarizers using additive manufacturing techniques. The process can be performed by the additive manufacturing device 110 of FIG. 1. As described above, the additive manufacturing device 110 can be a screen printing device or another type of conductive ink printing device, e.g., an inkjet printer, a 3D printer, or a device that performs pad printing, silk screen printing using a drum process, or silk screen printing using a flatbed process In step 202, an additive manufacturing device receives a template that defines an arrangement of meander-line arrays for a meander-line polarizer. Each meander-line array includes a sequence of alternating perpendicular conductive traces.

The template defines dimensions of each conductive trace and a location of each conductive trace in the arrangement. In some implementations in which the additive manufacturing device is a screen printing device, the template can be a screen with an aperture for each meander-line array. The aperture for each meander-line array can be in the shape and size of the meander-line array. In this way, conductive ink that flows through the aperture to the surface of the dielectric substrate will form the meander-line array on the surface of the substrate while the remaining screen blocks conductive ink from forming on other areas of the surface of the dielectric substrate.

In some implementations in which the additive manufacturing device is an inkjet printer, the template can be an image that depicts the meander-line arrays. For example, the image can depict a white background with meander-line arrays in black. The dimensions and arrangement of the meander-line arrays in the image can correspond to the dimensions and arrangement of the meander-line arrays of the meander-line polarizer. In implementations in which the additive manufacturing device is a 3D printer, the template can be a 3D model of the meander-line arrays and/or the dielectric substrate, e.g., stored in a .STL file.

In step 204, the additive manufacturing device receives a dielectric substrate made of a polyester polymer material, e.g., PET. The dielectric substrate can be placed on a surface of the additive manufacturing device. For example, the dielectric substrate can be placed on the surface by an automated feed or by a person. As described above, in 3D printing implementations, the 3D printer can also print the dielectric substrate.

In step 206, the additive manufacturing device generates, using the template, the meander-line arrays on the surface of the dielectric substrate. The additive manufacturing device can generate the meander-line arrays by applying, for each conductive trace of the meander-line arrays, conductive ink to the surface of the dielectric substrate in the location for the conductive trace defined by the template and with the dimensions for the conductive trace defined by the template.

For example, as described above, the conductive ink can be applied to the top surface of a screen in a screen printing implementation. The conductive ink can flow through the apertures in the screen to reach the surface of the dielectric substrate. A scraper can then be applied to the screen to push conductive ink through the apertures and to remove excess conductive ink from the screen. The screen can be removed, leaving the conductive ink for the meander-line arrays in place on the surface of the dielectric substrate, forming the meander-line polarizer.

In an inkjet or 3D printer implementation, a print head can apply conductive ink to the surface of the substrate based on the template. For example, the print head can iteratively move back and forth across the surface of the dielectric substrate applying conductive ink in the appropriate places to form the conductive traces of the meander-line arrays (and/or the substrate in 3D printer implementations).

In optional step 208, the meander-line polarizer can be post-processed to ensure that the conductive traces of the meander-line polarizer were formed within tolerances for the conductive traces. The post-processing can include measuring the length, width, and/or depth of each conductive trace, e.g., using computer vision techniques that analyze an image of the meander-line polarizer. If a length, width, or depth of a conductive trace exceeds a respective maximum limit, a photo-etcher (or other appropriate trace removal device) can remove excess conductive ink from the conductive trace until the conductive trace is within the tolerances. For example, an image analyzer that analyses the image of the meander-line polarizer can identify places in a conductive trace that should be removed. The image analyzer can provide, to the etcher, data specifying the identified places. The etcher can then remove the conductive trace from the identified places.

Similarly, if a length, width, or depth of a conductive trace is less than a respective minimum limit, additional conductive ink can be applied in the appropriate places, e.g., using an inkjet printer. For example, an image analyzer than analyses the image of the meander-line polarizer can identify places in a conductive trace that requires additional conductive ink. The image analyzer can provide, to the inkjet printer, data specifying the identifies places. The meander-line polarizer can be placed in the print area of the inkjet printer. The inkjet printer can then apply additional conductive ink to the identified places.

In some implementations, machine visions techniques can be used to discover blemishes. The additive manufacturing device 110, or another device, can then use a laser to remove any excess conductive ink. The additive manufacturing device 110 can also touch up areas by reprinting over affected areas that need more conductive ink. For example, the additive manufacturing device 110, can print, test, and reprint the meander-line arrays until they are in tolerance.

FIG. 3 is a flow diagram that illustrates an example screen printing process 300 for producing meander-line polarizers. The process can be performed by a screen printing device.

In step 302, a screen is applied to a dielectric substrate. As described above, the substrate can be a thin film, e.g., a thin film made of PET or another appropriate polyester polymer or an appropriate plastic.

The screen can include meander-line array apertures for meander-line arrays of the meander-line polarizer. Each meander-line array aperture includes a sequence of alternating perpendicular strips that correspond to alternating perpendicular conductive traces of the meander-line polarizer. The screen defines the arrangement of the meander-line arrays that will be formed on the dielectric substrate. For example, the meander-line array apertures of the screen define the location of each meander-line array and its conductive traces relative to each other meander-line array.

The meander-line array apertures of the screen also define the dimensions of each conductive trace.

The screen can be placed on a surface of the dielectric substrate. For example, an automated feed or person can place the screen on the surface of the dielectric substrate.

In step 304, conductive ink is applied to the screen and dielectric substrate. The conductive ink can be copper ink, silver ink, or another appropriate conductive ink. The conductive ink can be applied to the top of the screen so that the conductive ink can flow through the apertures in the screen to form the conductive traces of the meander-line arrays.

In step 306, excess conductive ink is removed from the screen. As described above, a scraper can then scrape excess conductive ink from the template and/or push the conductive ink into and through the apertures. The scraper, which can be a squeegee, can be applied to one side of the screen and moved across the top surface of the screen from side to the other to remove the excess conductive ink. The scraper can be moved across the top surface of the screen once or multiple times.

In step 308, the screen is removed from the dielectric substrate, leaving the conductive traces formed by the conductive ink that flows through the apertures. The conductive ink can dry on the surface of the dielectric substrate, resulting in the meander-line polarizer. As described above, post processing techniques can be used to ensure that the conductive traces are formed properly.

FIG. 4 is a flow diagram that illustrates an example printing process 400 for producing meander-line polarizers. The example process 400 can be performed by an inkjet printer, a 3D printer, or another appropriate conductive ink printing device.

In step 402, an inkjet or 3D printer receives a template for a meander-line polarizer. The template can define the arrangement of meander-line arrays for the meander-line polarizer. For example, the template can define the dimensions and location of each conductive trace of each meander-line array.

As described above, the template can be an image that shows the meander-line arrays rather than having meander-line array apertures. For example, the image can depict a white background with meander-line arrays in black. The dimensions and arrangement of the meander-line arrays in the image can correspond to the dimensions and arrangement of the meander-line arrays of the meander-line polarizer. For 3D printer implementations, the template can be a 3D model.

In step 404, the inkjet or 3D printer receives a dielectric substrate. As described above, the substrate can be a thin film, e.g., a thin film made of PET or another appropriate polyester polymer or an appropriate plastic. The dielectric substrate can be placed in a print area of the printer, e.g., by an automated loader or by a person. As described above, a 3D printer can also print the substrate using a 3D model of the substrate, e.g., defined by the template or another template.

In step 404, the inkjet or 3D printer adds conductive ink to the dielectric substrate based on the template. For example, the print head of the printer can apply conductive ink to the surface of the substrate based on the template. The print head can iteratively move back and forth across the surface of the dielectric substrate from one end of the substrate to the other, applying conductive ink in the appropriate places to form the conductive traces of the meander-line arrays.

The conductive ink can then dry on the surface of the dielectric substrate, e.g., using a dryer, to produce the meander-line polarizer. As described above, post-processing techniques can also be used to ensure that the conductive traces are formed properly.

Embodiments of the invention and all of the functional operations described in this specification may be implemented in digital electronic circuitry, or in computer software, firmware, or hardware, including the structures disclosed in this specification and their structural equivalents, or in combinations of one or more of them. Embodiments of the invention may be implemented, in part, as one or more computer program products, i.e., one or more modules of computer program instructions encoded on a computer-readable medium for execution by, or to control the operation of, data processing apparatus. The computer readable medium may be a non-transitory computer readable storage medium, a machine-readable storage device, a machine-readable storage substrate, a memory device, a composition of matter effecting a machine-readable propagated signal, or a combination of one or more of them. The term "data processing apparatus" encompasses all apparatuses, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) may be written in any form of programming language, including compiled or interpreted languages, and it may be deployed in any form, including as a stand-alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

While this specification contains many specifics, these should not be construed as limitations on the scope of the invention or of what may be claimed, but rather as descriptions of features specific to particular embodiments of the invention. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

Thus, particular embodiments of the invention have been described. Other embodiments are within the scope of the following claims. For example, the actions recited in the claims may be performed in a different order and still achieve desirable results.

What is claimed is:

1. A method for producing a meander-line polarizer, the method being performed by an additive manufacturing device, the method comprising:
   receiving, by the additive manufacturing device, a template that defines an arrangement of meander-line arrays for the meander-line polarizer, each of the meander-line arrays including a sequence of alternating perpendicular conductive traces, the template defining dimensions of each conductive trace and a location of each conductive trace in the arrangement;
   receiving, by the additive manufacturing device, a dielectric substrate made of a polyester polymer material; and
   generating, by the additive manufacturing device and using the template, the meander-line arrays on the surface of the dielectric substrate by applying, for each of the conductive traces, conductive ink from an ink supply for the additive manufacturing device to the surface of the dielectric substrate in the location for the conductive trace defined by the template and with the dimensions for the conductive trace defined by the template.

2. The method of claim 1, wherein receiving the dielectric substrate made of the polyester polymer material comprises receiving a dielectric substrate made of polyethylene terephthalate (PET).

3. The method of claim 1, wherein:
   the template comprises a screen that includes an aperture for each of the meander-line arrays, wherein the apertures for the meander-line arrays are located in the screen at respective locations defined by the template; and
   applying, for each of the conductive traces, conductive ink to the surface of the dielectric substrate comprises:
      placing the screen over the surface of the dielectric substrate; and
      applying the conductive ink over the screen.

4. The method of claim 3, wherein applying, for each conductive trace, conductive ink to the surface of the dielectric substrate comprises spreading the conductive ink across the screen and into the apertures.

5. The method of claim 4, wherein spreading the conductive ink across the screen and into the apertures comprises moving a scraper over the screen from a first side of the screen to a second side of the screen opposite the first side of the screen.

6. The method of claim 5, wherein:
   the additive manufacturing device is a screen printing device; and
   receiving, by the additive manufacturing device, a dielectric substrate made of a polyester polymer material comprises receiving a portion of a roll of the dielectric substrate.

7. The method of claim 1, further comprising:
   determining that a particular conductive trace of a particular meander-line array applied to the surface of the dielectric substrate has a width that is greater than a maximum width for the particular conductive trace defined by the template; and
   removing, using etching or a laser, at least a portion of the particular conductive trace such that the width of the particular trace is equal to or less than the maximum width.

8. The method of claim 1, wherein the conductive ink comprises one of conductive copper ink or conductive silver ink.

9. The method of claim 1, wherein applying, for each conductive trace, conductive ink to the surface of the dielectric substrate comprises applying, by an inkjet printer, the conductive ink for each conductive trace in a location on the surface of the dielectric substrate defined by the template.

* * * * *